United States Patent
Ohmori et al.

[11] Patent Number: 6,054,774
[45] Date of Patent: *Apr. 25, 2000

[54] THIN TYPE SEMICONDUCTOR PACKAGE

[75] Inventors: Jun Ohmori, Tokyo; Hiroshi Iwasaki, Kanagawa-ken, both of Japan

[73] Assignee: Kabushiki Kaisha Toshiba, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/890,633

[22] Filed: Jul. 9, 1997

Related U.S. Application Data

[63] Continuation of application No. 08/717,748, Sep. 23, 1996, abandoned, which is a continuation of application No. 08/407,892, Mar. 21, 1995, abandoned.

[30] Foreign Application Priority Data

Mar. 22, 1994 [JP] Japan .................................. 6-050758

[51] Int. Cl.⁷ .................................................. H01L 29/41
[52] U.S. Cl. ........................ 257/786; 257/679; 257/692; 257/778
[58] Field of Search .................................... 257/679, 690, 257/691, 692, 773, 786, 777, 778, 780; 235/488, 492

[56] References Cited

U.S. PATENT DOCUMENTS

| | | |
|---|---|---|
| 4,264,917 | 4/1981 | Ugon . |
| 4,703,420 | 10/1987 | Irwin . |
| 4,837,628 | 6/1989 | Sasaki . |
| 4,843,225 | 6/1989 | Hoppe ..................................... 257/679 |
| 4,882,702 | 11/1989 | Struger et al. . |
| 4,916,662 | 4/1990 | Mizuta . |
| 4,943,464 | 7/1990 | Gloton et al. . |
| 4,961,105 | 10/1990 | Yamamoto .............................. 257/679 |
| 4,980,856 | 12/1990 | Ueno . |
| 5,018,017 | 5/1991 | Sasaki et al. . |

(List continued on next page.)

FOREIGN PATENT DOCUMENTS

| | | |
|---|---|---|
| 0 214 478 | 3/1987 | European Pat. Off. . |
| 0 228 278 | 7/1987 | European Pat. Off. . |
| 0 321 326 | 6/1989 | European Pat. Off. . |
| 0 385 750 | 9/1990 | European Pat. Off. . |
| 0 406 610 | 1/1991 | European Pat. Off. . |
| 0 476 892 | 3/1992 | European Pat. Off. . |
| 57-0010251 | 1/1982 | Japan ..................................... 257/786 |
| 62-2706 | 1/1987 | Japan . |
| 2-301155 | 12/1990 | Japan . |
| 3-14192 | 1/1991 | Japan . |
| 3-2099 | 1/1991 | Japan . |
| 3-114788 | 5/1991 | Japan . |
| 4-16396 | 1/1992 | Japan . |
| 4-148999 | 5/1992 | Japan . |
| 5-17269 | 5/1993 | Japan . |
| 5-134820 | 6/1993 | Japan . |
| 6-195524 | 7/1994 | Japan . |
| 6-236316 | 8/1994 | Japan . |
| 6-318390 | 11/1994 | Japan . |
| 936796 | 10/1995 | Japan . |

OTHER PUBLICATIONS

Japanese Industrial Standard, "Integrated Circuit Cards with Contacts–Physical Characteristics and Location of Contact", JIS X 6303, 1988.

E. Harari, Nikkei Electronics, Feb. 17, 1992, pp. 155–168.

*Primary Examiner*—David B. Hardy
*Attorney, Agent, or Firm*—Finnegan, Henderson, Farabow, Garrett & Dunner, L.L.P.

[57] ABSTRACT

A semiconductor package having a board, at least one semiconductor chip, and flat type external connecting terminals, the board having a wiring circuit including connecting portions on a first main surface, the semiconductor being mounted on the first main surface, the flat type external connecting terminals being electrically connected to the semiconductor chip and formed on a second main surface of the board, wherein the flat type external connecting terminals are disposed in such a manner that any straight line which is arbitrarily drawn across the surface of a region to form the flat type external connecting terminals of the board runs on at least one of the flat type external connecting terminals.

26 Claims, 4 Drawing Sheets

U.S. PATENT DOCUMENTS

| | | |
|---|---|---|
| 5,091,618 | 2/1992 | Takahashi . |
| 5,153,818 | 10/1992 | Mukougawa et al. . |
| 5,155,663 | 10/1992 | Harase . |
| 5,172,338 | 12/1992 | Mehrotra et al. . |
| 5,216,278 | 6/1993 | Lin et al. ................................. 257/688 |
| 5,272,374 | 12/1993 | Kodai et al. . |
| 5,276,317 | 1/1994 | Ozouf et al. . |
| 5,285,352 | 2/1994 | Pastore et al. .......................... 257/712 |
| 5,293,236 | 3/1994 | Adachi et al. . |
| 5,297,029 | 3/1994 | Nakai et al. . |
| 5,297,148 | 3/1994 | Harari et al. . |
| 5,299,089 | 3/1994 | Lwee . |
| 5,327,010 | 7/1994 | Venaka et al. .......................... 257/679 |
| 5,343,319 | 8/1994 | Moore . |
| 5,375,037 | 12/1994 | LeRoux . |
| 5,388,084 | 2/1995 | Itoh et al. . |
| 5,430,859 | 7/1995 | Norman et al. . |
| 5,438,359 | 8/1995 | Aoki . |
| 5,457,590 | 10/1995 | Barrett et al. . |
| 5,469,399 | 11/1995 | Sato et al. . |
| 5,475,441 | 12/1995 | Parulski et al. . |
| 5,488,433 | 1/1996 | Burkhart . |
| 5,508,971 | 4/1996 | Cernea et al. . |
| 5,509,018 | 4/1996 | Niijima et al. . |
| 5,535,328 | 7/1996 | Harari et al. . |
| 5,550,709 | 8/1996 | Iwasaki ................................... 361/684 |
| 5,552,632 | 9/1996 | Iwasaki ................................... 257/679 |
| 5,563,825 | 10/1996 | Cernea et al. . |
| 5,566,105 | 10/1996 | Tanaka et al. . |
| 5,568,424 | 10/1996 | Cernea et al. . |
| 5,572,466 | 11/1996 | Sukegawa . |
| 5,572,478 | 11/1996 | Sato et al. . |
| 5,584,043 | 12/1996 | Burkart . |
| 5,592,420 | 1/1997 | Cernea et al. . |
| 5,596,532 | 1/1997 | Cernea et al. . |
| 5,602,987 | 2/1997 | Harari et al. . |
| 5,608,673 | 3/1997 | Rhee . |
| 5,611,057 | 3/1997 | Pecone et al. . |
| 5,615,344 | 3/1997 | Corder . |
| 5,621,685 | 4/1997 | Cernea et al. . |
| 5,638,321 | 6/1997 | Lee et al. . |
| 5,663,901 | 9/1997 | Wallace et al. . |
| 5,671,229 | 9/1997 | Harari et al. . |
| 5,887,145 | 3/1999 | Harari et al. . |

THIN TYPE SEMICONDUCTOR PACKAGE

This is a continuation of application Ser. No. 08/717,748, filed Sep. 23, 1996, now abandoned which is a continuation of application Ser. No. 08/407,892 filed Mar. 21, 1995, now abandoned.

BACKGROUND OF THE INVENTION

1. Field of the Invention

The present invention relates to a semiconductor package in particular, to a semiconductor package that is small and thin and that is suitable for a card type external storage medium or the like.

2. Description of the Related Art

A memory card that accommodates a semiconductor package having a memory function has a limited size (length, width, and thickness). Thus, the semiconductor package that has a memory function and the like should be thinly and compactly constructed so that it almost conforms with the outer shape of a semiconductor chip.

To satisfy such thin construction (for example, requirement of a space of 1 mm or less), TAB (Tape Automated Bonding) method, flip-chip mounting method, COB (Chip on Board) method, and so forth are known. FIGS. 1 and 2 show an example of a thin type package. Referring to FIGS. 1 and 2, a semiconductor chip 1 is mounted on a first main surface of a circuit board 2. External connecting terminals 4 are connected to a second main surface of the circuit board 2 via through-holes 3. A region on which the semiconductor chip 1 is mounted is sealed with a molded resin layer 5. Alternatively, the peripheral portion of the semiconductor chip 1 is sealed with a potting resin layer 5'. In FIG. 1, reference numeral 4a represents a bonding layer of the semiconductor chip 1 and reference numeral 6 represents bonding wires. In FIG. 2, reference numeral 1a represents bumps of the semiconductor chip 1.

In the construction of such a thin type package, as shown in FIG. 3, the external connecting terminals 4 are formed on the second main surface of the circuit board 2 with equal pitches in X and Y directions in a rectangular shape. The circuit board 2 has a wiring circuit that includes a connecting portion on the first main surface. Aluminum oxide, aluminum nitride, glass fiber reinforced epoxy resin, or the like is used as an insulator of the circuit board 2.

When one surface of the circuit board is sealed, the resultant semiconductor package can be more thinly constructed than the conventional molded plastic package (with a thickness of 1.0 to 1.2 mm). In consideration of the feature of thin construction, the thickness of the circuit board 2 is reduced to as small as 0.1 to 0.2 mm. However, as the thickness of the circuit board 2 is reduced, it tends to be deformed by a mechanical external stress (such as bending force and twisting force). Thus, in this case, the mounted semiconductor chip 1 tends to be damaged.

When a plurality of semiconductor chips are mounted, the size of the semiconductor chip 1 is large, or a large semiconductor package with a large number of pins is used, the damage of the semiconductor chip 1 will be more serious. An experiment was performed in the following manner. A semiconductor chip 1 was mounted on a 0.2-mm thick resin type circuit board 2 having flat type external connecting terminals 4 formed as shown in FIG. 3 in face-up relation (see FIG. 1) or in face-down relation (see FIG. 2). Thereafter, one surface of the circuit board 2 was sealed with a transfer mold and thereby a semiconductor package was fabricated. With the semiconductor package, a memory card, as shown in FIGS. 8 and 9, was fabricated. An external stress (such as bending force or twisting force) was applied to the memory card. Experimental results show that stress is concentrated to portions that section the flat type external connecting terminals (for example, portions of straight lines in parallel with sides of the circuit board 2 and portions of straight lines that are oblique to sides of the circuit board 2). In these portions, the circuit board 2 tends to be broken.

Therefore, a first object of the present invention is to provide a semiconductor package with high reliability.

A second object of the present invention is to provide a semiconductor package of which the damage of a semiconductor chip due to an external stress is reduced.

A third object of the present invention is to provide a semiconductor package that is compact and that has high reliability.

A fourth object of the present invention is to provide a semiconductor package that is compact and of which the damage of a semiconductor chip due to an external stress is reduced.

SUMMARY OF THE INVENTION

A first aspect of the present invention is a semiconductor package having a board, at least one semiconductor chip, and flat type external connecting terminals, the board having a wiring circuit including a connecting portion on a first main surface, the semiconductor being mounted on the first main surface, the flat type external connecting terminals being electrically connected to the semiconductor chip and formed on a second main surface of the board, wherein the flat type external connecting terminals are disposed in such a manner that any straight line which is arbitrarily drawn across the surface of a region to form the flat type external connecting terminals of the board runs through at least one of the flat type external connecting terminals.

A second aspect of the present invention is a semiconductor package having a board, at least one semiconductor chip, a resin layer, and flat type external connecting terminals, the board having a wiring circuit including a connecting portion on a first main surface, the semiconductor being mounted on the first main surface, the resin layer being filled in a space formed between the semiconductor chip surface and the board surface, the flat type external connecting terminals being electrically connected to the semiconductor chip and formed on a second main surface of the board, wherein the flat type external connecting terminals are disposed in such a manner that any straight line which is arbitrarily drawn across the surface of a region to form the flat type external connecting terminals of the board runs through at least one of the flat type external connecting terminals.

A third aspect of the present invention is the semiconductor package of the first or second aspect, wherein part of the flat type external connecting terminals formed on the second main surface of the board composes dummy connecting terminals.

A fourth aspect of the present invention is the semiconductor of the first, second, or third aspect, wherein the flat type external connecting terminals formed on the second main surface of the board are asymmetrically disposed with a separating portion of a curved line.

According to the present invention, a semiconductor chip is mounted on a first main surface (one surface) of a resin type board or a ceramic type board in face-down relation or in face-up relation connected by a wire bond method, and is thinly and compactly constructed at low cost. In addition, at least part of flat type external connecting terminals formed on a second main surface of the board is not regularly sectioned on a straight line in parallel with a side of the board and a straight line that is oblique to a side of the board.

According to the present invention, the flat type external connecting terminals are disposed in such a manner that any straight line which is arbitrarily drawn across the surface of a region to form the flat type external connecting terminals of the board runs on at least one of the flat type external connecting terminals. In other words, portions separating each of the flat type external connecting terminals do not form a straight line which passes through from one side of the board to other sides of the board. Thus, an external stress can be prevented from being concentrated on each straight line (region). Thus, the semiconductor package can be compactly and thinly constructed with improved mechanical strength.

In the pre sent invention, the flat type external connecting terminals formed on the second main surface of the board are not regularly sectioned by straight lines in parallel with sides of the board or by straight lines that are oblique to sides of the board. FIG. 4 to FIG. 7 show examples of arrangements of the flat type external connecting terminals. In these examples, the flat type external connecting terminals are disposed in such a manner that any straight line which is arbitrarily drawn across the surface of a region to form the flat type external connecting terminals of the board runs on at least one of the flat type external connecting terminals. That is, on a straight line in parallel with a side of the board 7 (in the direction of A or B) and a straight line that is oblique to the side of the board 7 (in the direction of A' or B'), at least one of the external connecting terminals $8_1$, $8_2$, $8_3$, $8_4$, $8_5$, $8_6$, $8_7$, $8_8$, . . . $8_n$ is disposed.

In other words, a region 7a that separates the external connecting terminals $8_1$, $8_2$, $8_3$, $8_4$, $8_5$, $8_6$, $8_7$, $8_8$, . . . $8_n$ prevents straight lines from extending in parallel with sides of the board 7 or oblique thereto. In addition, in the directions in parallel with the sides of the board 7 (the directions of A and B) and in the directions that are oblique to the sides of the board 7 (the directions of A' and B'), any of the external connecting terminals $8_1$, $8_2$, $8_3$, $8_4$, $8_5$, $8_6$, $8_7$, $8_8$, . . . $8_n$ should be disposed.

Since the flat type external connecting terminals are disposed in such a manner, when an external stress is applied to the board 7, the stress can be easily dispersed or absorbed. Thus, the damage of the board 7 due to the concentration of the external stress and the damage of the semiconductor chip can be easily reduced.

In the Embodiment shown in FIG. 7, the flat type terminals are separated at the center portion of the board with regions having curved lines. Thereby, the damage of the board 7 due to the twisting force in addition to the bending force can be prevented.

According to the first semiconductor package of the present invention, since the semiconductor chip is mounted on one surface of the board and external connecting terminals are formed on the rear surface of the board, the semiconductor package can be thinly and compactly constructed. In addition, since all the external connecting terminals are not disposed with constant pitches in X and Y directions, an external stress can be prevented from being concentrated on part of the board. Thus, the breakage and damage of the board can be remarkably suppressed and prevented. In addition, the damage of the semiconductor chip due to the external stress can be remarkably reduced, thereby improving the reliability thereof.

According to the second semiconductor package of the present invention, the semiconductor chip mounted on the board is sealed with a resin. Thus, the breakage and damage of the board and the semiconductor chip can be further suppressed and prevented. Consequently, the reliability of the semiconductor package is further improved.

When part of the external connecting terminals are dummy connecting terminals, the semiconductor package can be easily aligned with a circuit board and mounted thereon. In this case, the electrical connections of the semiconductor package and the circuit board can be secured. When the external connecting terminals are symmetrically disposed with a curved separating region (for example, in an S letter shape), the breakage and damage of the board due to the external stress can be suppressed and prevented. In addition, the damage of the semiconductor chip can be more effectively reduced.

These and other objects, features and advantages of the present invention will become more apparent in light of the following detailed description of a best mode embodiment thereof, as illustrated in the accompanying drawings.

DESCRIPTION OF THE PREFERRED EMBODIMENTS

Next, with reference to FIG. 7, an embodiment of the present invention will be described.

First Embodiment

Figure 2:
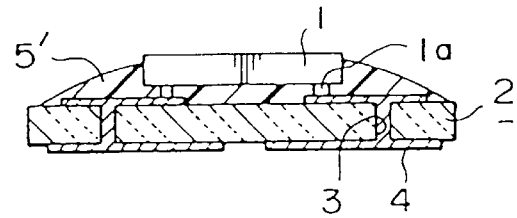
FIG. 2 is a sectional view showing another construction of principal portions of a conventional one-side-sealed type semiconductor package.
Figure 3:
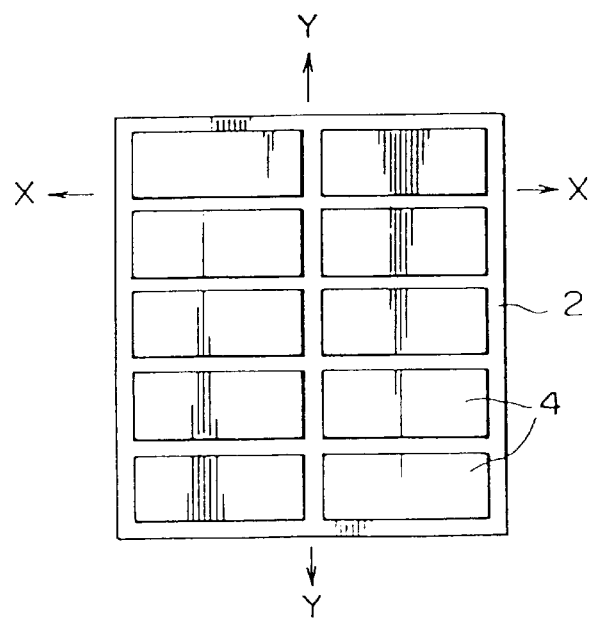
FIG. 3 is a plan view showing an arrangement of flat type external connecting terminals of a conventional one-side-sealed type semiconductor package.
Figure 4:
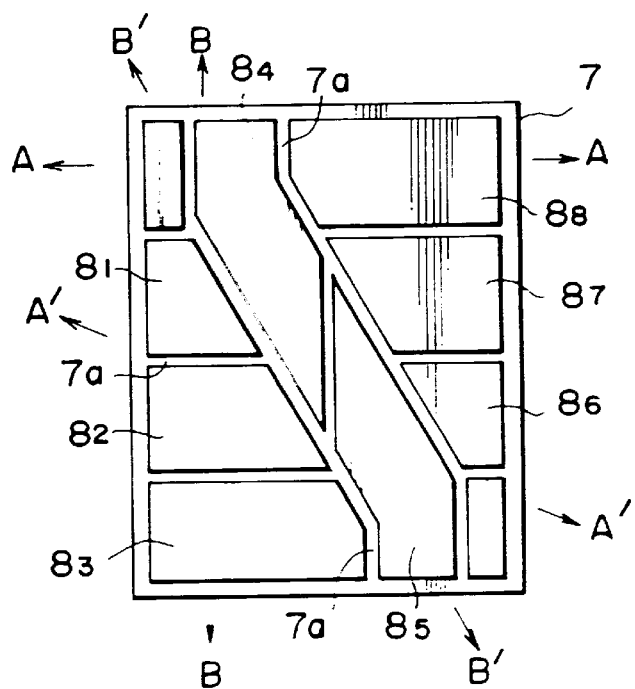
FIG. 4 is a plan view showing an arrangement of flat type external connecting terminals of a semiconductor package according to the present invention.
Figure 5:
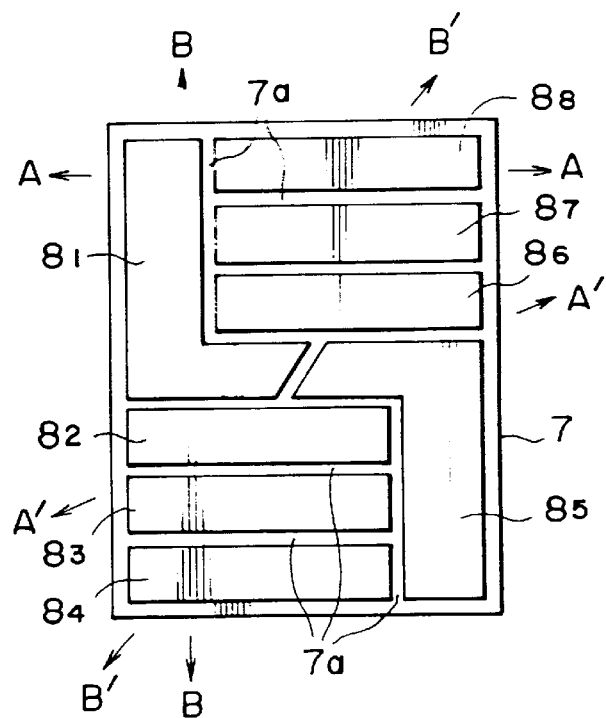
FIG. 5 is a plan view showing another arrangement of flat type external connecting terminals of a semiconductor package according to the present invention.
Figure 6:
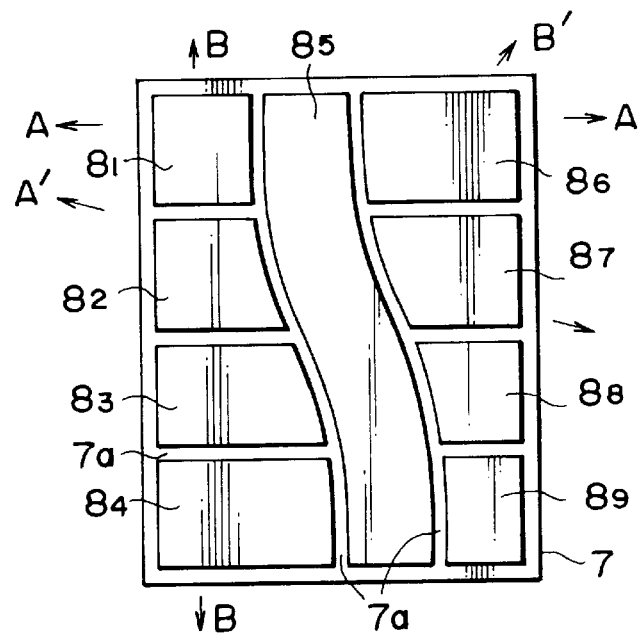
FIG. 6 is a plan view showing another arrangement of flat type external connecting terminals of a semiconductor package according to the present invention.
Figure 7:
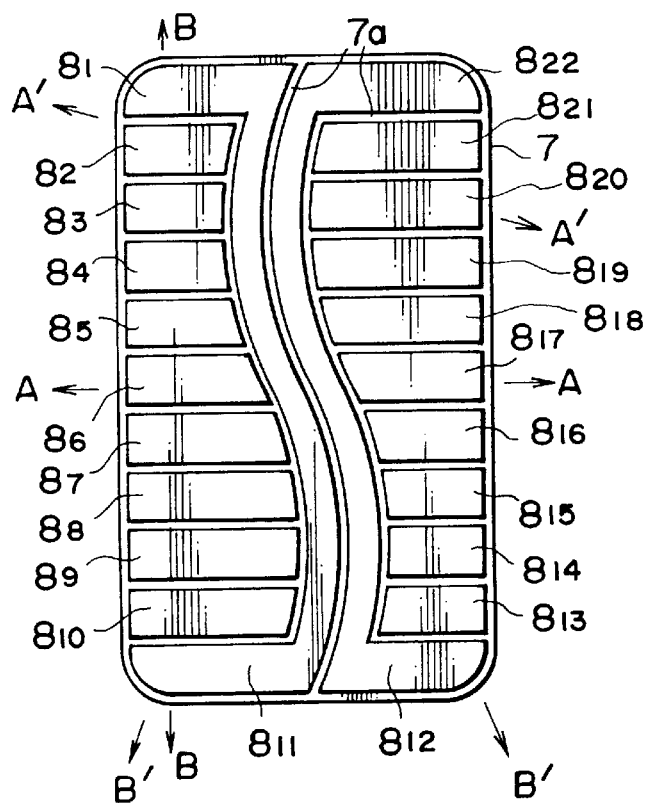
FIG. 7 is a plan view showing another arrangement of flat type external connecting terminals of a semiconductor package according to the present invention.
Figure 8:
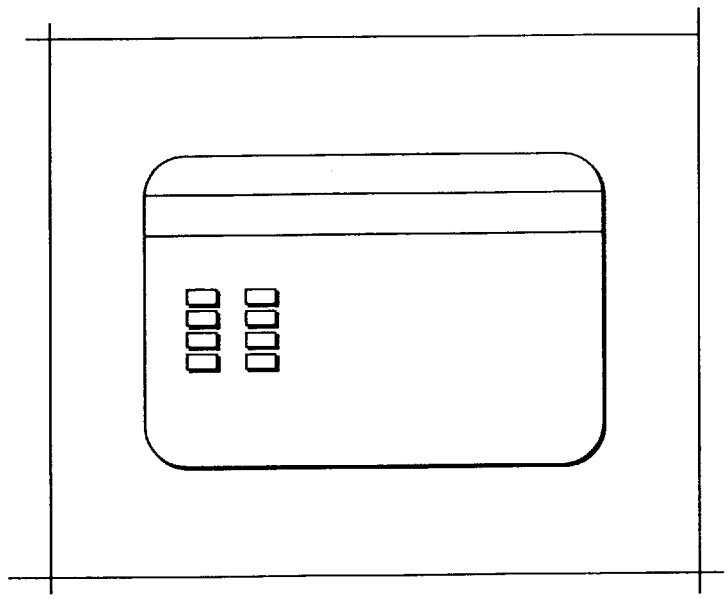
FIG. 8 is a plan view showing one side of a memory card as defined and illustrated in JIS X 6303.
Figure 9:
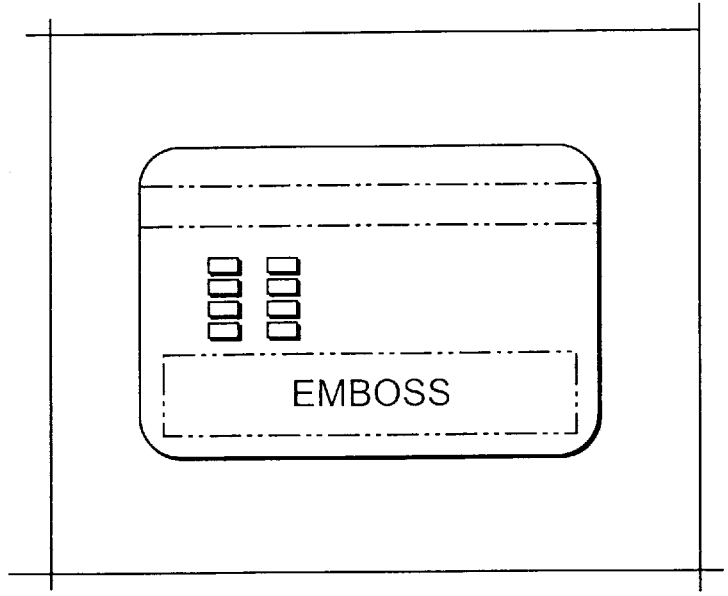
FIG. 9 is a plan view showing the opposite side of the memory card shown in FIG. 8.

FIG. 7 is a bottom view showing a construction of principal portions of a semiconductor package according to the present invention. In other words, the semiconductor package of this embodiment is a semiconductor package for use with a memory card as shown in FIG. 2. In the semiconductor package of the present invention, the shapes of the flat type external connecting terminal blocks $8_1$, $8_2$, . . . , $8_n$ formed on the board 7 vary each other. The board 7 is a resin board having a wiring circuit with a connecting portion. The length, width, and thickness of the board 7 are 30 mm, 20 mm, and 0.2 mm, respectively. Each corner of the corner 7 is chamfered. In addition, as shown in FIG. 7, the flat type external connecting terminals $8_1$, $8_2$, $8_3$, $8_4$, $8_5$, $8_6$, $8_7$, $8_8$, ... $8_n$ are formed on the second main surface (rear surface) of the circuit board 7. In other words, in this embodiment, at least part of any of the flat type external connecting terminals $8_1$, $8_2$, $8_3$, $8_4$, $8_5$, $8_6$, $8_7$, $8_8$, ... $8_n$ formed on the second main surface of the resin board 7 is dispersively disposed on a straight line in parallel with a side of the board 7 and a straight line that is oblique to a side of the board 7.

In the Embodiment shown in FIG. 7, the flat type terminals are separated at the center portion of the board with regions having curved lines. Thereby, the damage of the board 7 due to the twisting force in addition to the bending force can be prevented.

Incidently, the board having a wiring circuit is produced by the steps of preparing a resin type board, providing in the predetermined positions of the board through holes connecting both main surfaces of the board, forming a wiring circuit including connecting portions on the first main surface of the board by screen-printing a conductive paste and drying them, and thereafter forming flat type external connecting terminals $8_1$, $8_2$, $8_3$, ... $8_n$ by screen-printing the conductive paste and drying them.

Next, an example of fabrication of the semiconductor package will be described.

The above-described resin type board 7 is secured on a stage of for example a screen printer with a vacuum sucking mechanism. Connecting pads are formed on the connecting portion on the resin type board 7 corresponding to electrode pads of a semiconductor chip to be mounted. The connecting pads are formed by printing a silver paste with a mask having an opening corresponding to the electrode pads of the semiconductor chip. For example, with a metal mask having an opening of 150×150 $\mu$m corresponding to the electrode pads 100×100 $\mu$m, a silver paste (whose particle diameter is 1 $\mu$m and viscosity is 1000 ps) is screen-printed on the first main surface of the resin type board 7 so as to form connecting pads (whose diameter is 150 $\mu$m and height is approximately 80 $\mu$m) on the connecting portion.

Next, a semiconductor chip of which connecting gold bumps have been formed on the surface of electrode pads is prepared. Alternatively, a semiconductor chip of which gold ball bumps (whose height is 30 $\mu$m, width is 100 $\mu$m, and length is 100 $\mu$m) have been formed corresponding to ball bonding method is prepared.

On the first main surface of the resin type board 7, the connecting pads thereof are aligned with the connecting gold bumps of the semiconductor chip and disposed thereon. Thereafter, the connecting portions being aligned with each other are pressured so that at least edge portions thereof are inserted. Thus, a semiconductor package is assembled. In this state, the silver paste that composes the connecting pads is cured by heat. This process is referred to as flip chip bonding process.

Thereafter, a process using a sealing resin is performed. In other words, a sealing resin (for example, an epoxy resin that has a low viscosity) is dripped to the edge side of the peripheral portion of the resin type board 7 and then heated. The sealing resin is filled in a space portion formed between the semiconductor chip surface and the resin type board surface from one edge side of the space portion by using capillary action. Thereafter, the filled resin is cured (solidified) by heat. Thus, a semiconductor package as shown in FIG. 2 is fabricated. At this point, with the filled resin layer, the semiconductor chip of the semiconductor package is well secured to the surface of the resin type board 7. In addition, with the filled resin, the surface of the resin type board 7 of the semiconductor chip is well insulated. Although the upper surface of the semiconductor chip 8 is exposed to the outside, since silicon that composes the semiconductor chip is solid and hard, the surface of the semiconductor package is well protected. Experimental results show that a problem of reliability or the like of the semiconductor package does not take place.

Thereafter, the semiconductor package is mounted in a memory card. In consideration of a required function, external stress (bending force, twisting force, and so forth) that is normally applied was intentionally applied to the memory card so as to evaluate the semiconductor package. In other words, the semiconductor package was mounted on the card and external force was applied to the card corresponding to the card test method defined in JIS X 6303. Thereafter, the appearance of the semiconductor package was observed and evaluated. As results, breakage and fine cracks were not observed on the board 7 at all. Thereafter, the functional test and evaluation of the semiconductor package were performed. As results, damage of the semiconductor chip was not observed.

In the above embodiment, the resin type board 7 has the wiring circuit with the connecting portion formed on the first main surface. The length, width, and thickness of the resin type board are 30 mm, 20 mm, and 0.2 mm, respectively. Each corner of the resin type substrate 7 is chamfered. The number of electrode terminals is 22. Experimental results show that a semiconductor package on which a resin type board with eight electrode terminals or nine electrode terminals and a corresponding semiconductor chip have been mounted has the same operation and effects as those of the first embodiment.

Figure 1:
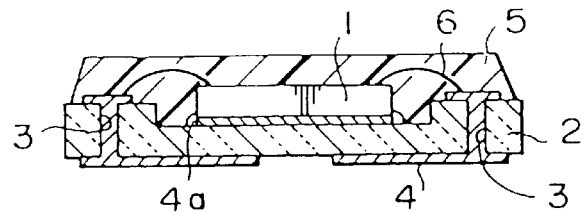
FIG. 1 is a sectional view showing a construction of principal portions of a conventional one-side-sealed type semiconductor package.

Next, a semiconductor package on which a semiconductor chip is mounted in face-up relation will be described. In this case, a semiconductor chip was mounted on a board in face-up relation. The semiconductor chip was connected to connecting portion of the wiring circuit of the board corresponding to wire bonding method. Thereafter, a semiconductor package was constructed in the same manner as FIG. 1 except that the entire mounting region of the semiconductor chip was sealed with a transfer mold. The connecting terminals were unsymmetrically disposed on the rear surface of the board. Experimental results corresponding to the card test method defined in JIS X 6303 show that breakage or fine cracks does not take place.

Second Embodiment

A semiconductor chip was prepared. In the semiconductor chip, solder (for example, 63Sn-37Pb) was selectively plated or evaporated (with a solder mask) on the electrode pad surface (100×100 $\mu$m) and thereby connecting bumps with a height of 100 $\mu$m were formed. In addition, a resin type board (or alumina type board or aluminum type board) on which solder paste was screen-printed and thereby connecting pads were formed was prepared. Thereafter, the semiconductor chip was aligned with the first main surface of the resin type board and temporarily secured. Next, the resultant structure was loaded into a reflow furnace. In the reflow furnace, the resultant structure was heated at a temperature equal to or higher than a solder melting temperature (183° C.) and then the semiconductor chip was secured to the resin type board.

Thereafter, in the same conditions as the first embodiment, a sealing resin was selectively filled. Thus, a semiconductor package with the construction as shown in FIG. 2 was fabricated. The semiconductor package was thinly and compactly constructed with high reliability and high yield as with the first embodiment. When the semiconductor package was evaluated in the same manner as the first embodiment, breakage and fine cracks of the board did not take place at all. Thereafter, the functional test and evaluation of the semiconductor package were performed. As results, damage of the semiconductor chip did not take place.

In the above-mentioned embodiments, semiconductor packages of which one semiconductor chip is mounted on a board having a predetermined shape were described. However, the present invention is not limited to such semiconductor packages. Within the spirit and scope of the present invention, various modifications are available. For example, a plurality of semiconductor chips may be mounted on a board having a predetermined outer shape. Alternatively, a semiconductor package of which one or a plurality of semiconductor chips are mounted on a board having different outer dimensions may be accomplished.

As described above, according to the semiconductor package of the present invention, the flat type external connecting terminals are disposed in such a manner that any straight line which is arbitrarily drawn across the surface of a region to form the flat type external connecting terminals of the board runs on at least one of the flat type external connecting terminals, that is part of the flat type external connecting terminals formed on the rear surface of the board is always disposed on a straight line in parallel with a side of the board and a straight line that is oblique to a side of the board. In other words, at least part of the flat type external connecting terminals is always disposed in a region of which an external stress or the like is concentrated and crack tends to grow from the concentrated point so as to reinforce the board. Thus, damage of the board and semiconductor due to an external stress is suppressed. On the other hand, as a mold resin layer is omitted, removed, and reduced, the semiconductor package can be compactly and thinly constructed with high reliability of characteristics and functions.

Thus, according to the present invention, the semiconductor package can be compactly and thinly constructed. In addition, the bad influence of the external stress can be reduced (alleviated). Thus, the functions of the semiconductor package can be well maintained. Such advantages of the semiconductor package according to the present invention can adjust the characteristics and functions corresponding to the applications, thereby contributing to widening the applications.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A semiconductor package comprising:
   a board having oppositely facing first and second main surfaces and a wiring circuit including connecting portions on the first main surface;
   at least one semiconductor chip mounted on the first main surface of the board; and
   flat type external connecting terminals on the second main surface of the board and electrically connected to the semiconductor chip through the connecting portions of the wiring circuit, the flat type external connecting terminals each having an area size, being asymmetrically disposed on the second main surface of the board, and being spaced by a curved separating portion extending substantially across the second main surface, the area size, asymmetric disposition, and spacing of the flat type external connecting terminals being related so that all straight lines in a region containing the flat type external connecting terminals cross at least one flat type external connecting terminal, thereby to strengthen the board against bending.

2. The semiconductor package of claim 1, wherein the curved separating portion is of generally S-shaped configuration.

3. The semiconductor package of claim 1 including at least two of said curved separating portions on opposite sides on at least one of the flat type external connecting terminals extending substantially across the second main surface.

4. The semiconductor package of claim 1 including at least three of said curved separating portions, one of said curved separating portions lying between at least two of the flat type external connecting terminals extending substantially across the second main surface, and the other two of the at least three curved separating portions lying on opposite sides of the at least two of the flat type external connecting terminals extending substantially across the second main surface.

5. The semiconductor package of claim 1 including a resin layer filling a space between the semiconductor chip surface and the first main surface of the board.

6. The semiconductor package of claim 1, wherein said first main surface is recessed in the board to provide a relatively thick peripheral margin, the connecting portions of the wiring circuit being located in said peripheral margin, and including bonding wires connecting the semiconductor chip to the connecting portions.

7. The semiconductor package of claim 6 including a resin layer filling the recessed first main surface and encapsulating at least part of the semiconductor chip and the bonding wires.

8. The semiconductor package of claim 1, wherein the connecting portions of the wiring circuit are located in a peripheral margin of the board around the semiconductor chip, and including bonding wires connecting the semiconductor chip to the connecting portions.

9. The semiconductor package of claim 8 including a resin layer encapsulating at least part of the semiconductor chip and the bonding wires.

10. The semiconductor package of claim 1, wherein the semiconductor chip includes terminal bumps for connection to the connecting portions and including a resin layer filling a space between the semiconductor chip surface and the first main surface of the board.

11. The semiconductor package of claim 10, wherein the resin layer encapsulates at least the terminal bumps and a peripheral portion of the semiconductor chip.

12. A semiconductor package comprising:
   a generally rectangular board having oppositely facing first and second main surfaces joined by opposite side edges and opposite end edges;
   a wiring circuit including connecting portions on the first main surface;
   at least one semiconductor chip mounted on the first main surface of the board; and
   flat type external connecting terminals on the second main surface of the board and electrically connected to the semiconductor chip, the flat type external connecting terminals being spaced by linear separating portions perpendicular to the side edges of the board and spaced by at least one curved separating portion extending substantially between the end edges of the board.

13. The semiconductor package of claim 12, wherein at least two of the external connecting terminals include opposite end portions proximate to the opposite end edges of the board and joined by curved portions extending between the opposite end portions and uniformly spaced by the at least one curved separating portion.

14. The semiconductor package of claim 12, wherein the at least one curved separating portion is of generally S-shaped configuration.

15. A semiconductor package, comprising:
   a substrate having a first face, a second face, a wiring pattern formed on the first face, and at least one through hole;
   at least one semiconductor chip mounted on the first face of the substrate and having an electrode connected to the wiring pattern; and
   a conductive layer formed on the second face of the board, the conductive layer having grooves that divide the conductive layer into a plurality of flat type external connecting terminals, the flat type external connecting terminals being connected to the wiring pattern via the through hole, the grooves dividing the conductive layer asymmetrically, and including at least one smoothly curved groove running from a first end of the conductive layer to a second end to the conductive layer.

16. A semiconductor package as set forth in claim 15, wherein the grooves divide the conductive layer in such a manner that all straight lines across the surface of a region to form the flat type external connecting terminals run on at least one of the flat type external connecting terminals.

17. A semiconductor package as set forth in claim 16, wherein the at least one smoothly curved groove is generally S-shaped.

18. A semiconductor package as set forth in claim 15, wherein respective flat type external connecting terminals cover at least a region where the at least one through hole is formed.

19. A semiconductor package as set forth in claim 15, wherein the flat type external connecting terminals have side faces, and any pair of opposed side faces of the flat type external connecting terminals divided by the grooves are substantially parallel.

20. A card shaped storage medium comprising:
   a semiconductor package comprising,
      a substrate having a first face, a second face, a wiring pattern formed on the first face, and at least one though hole;
      at least one semiconductor chip mounted on the first face of the substrate and having an electrode connected to the wiring pattern;
      a conductive layer formed on the second face of the board, the conductive layer having grooves that divide the conductive layer into a plurality of flat type external connecting terminals, the flat type external connecting terminals connected to the wiring pattern via the through hole, the grooves dividing the conductive layer asymmetrically, and including at least one smoothly curved groove running from a first end of the conductive layer to a second end of the conductive layer; and
   a card for supporting the semiconductor package so that the conductive layer is exposed on a surface of the card.

21. A card shaped storage medium card as set forth in claim 20, wherein the grooves divide the conductive layer in such a manner that all straight lines across the surface of a region including the flat type external connecting terminals run on at least one of the flat type external connecting terminals.

22. A card shaped storage medium as set forth in claim 21, wherein the at least one smoothly curved groove is generally S-shaped.

23. A card shaped storage medium as set forth in claim 20, wherein respective flat type external connecting terminals cover at least regions where through holes are formed.

24. A card shaped storage medium as set forth in claim 20, wherein the flat type external connecting terminals have side faces, and any pair of opposed side faces of the flat type external connecting terminals divided by the grooves are substantially parallel.

25. A card shaped storage medium as set forth in claim 20, wherein the card has a thickness of less than 1 mm.

26. A card shaped storage medium as set forth in claim 20, wherein the board has a thickness in the range from about 0.1 mm to about 0.2 mm.

* * * * *

UNITED STATES PATENT AND TRADEMARK OFFICE
CERTIFICATE OF CORRECTION

PATENT NO.: 6,054,774

DATED: April 25, 2000

INVENTOR(S): Jun Ohmori et al.

It is certified that an error appears in the above-identified patent and that said Letters Patent is hereby corrected as shown below:

Claim 20, column 10, line 4, change "comprising," to --comprising:--.

Signed and Sealed this

Twentieth Day of March, 2001

*Attest:*

NICHOLAS P. GODICI

*Attesting Officer*    *Acting Director of the United States Patent and Trademark Office*